United States Patent [19]
Shono et al.

[11] Patent Number: 5,132,545
[45] Date of Patent: Jul. 21, 1992

[54] ION IMPLANTATION APPARATUS

[75] Inventors: Kazuhiro Shono; Shigeo Sasaki; Susumu Katoh, all of Amagasaki; Masao Naitou; Tetsuya Nakanishi, both of Kyoto; Naomitsu Fujishita; Kazuhiko Noguchi, both of Amagasaki; Masayasu Tanjo, Kyoto, all of Japan

[73] Assignees: Mitsubishi Denki Kabushiki Kaisha; Nisshin Denki Kaushiki Kaisha, Japan

[21] Appl. No.: 568,191

[22] Filed: Aug. 16, 1990

[30] Foreign Application Priority Data

Aug. 17, 1989 [JP] Japan .................................. 1-211832
Jan. 12, 1990 [JP] Japan ...................................... 2-5191
Apr. 27, 1990 [JP] Japan .................................. 2-114307

[51] Int. Cl.$^5$ ............................................ H01J 37/304
[52] U.S. Cl. .................................. 250/492.2; 250/398
[58] Field of Search ................. 250/492.21, 492.2, 398

[56] References Cited

U.S. PATENT DOCUMENTS

| 4,017,403 | 4/1917 | Freeman | 250/492.21 |
| 4,667,111 | 5/1987 | Glavish | 250/492.21 |
| 4,804,879 | 2/1989 | Fukumoto | 313/361.1 |
| 5,025,167 | 6/1991 | Okuda et al. | 250/398 |

FOREIGN PATENT DOCUMENTS 62-243231 10/1987 Japan .
63-289751 11/1988 Japan .
63-310549 12/1988 Japan .
1-98470 6/1989 Japan .

OTHER PUBLICATIONS

Satoh et al., "Ion Beam System for the New High Current Ion Implantation System Extrion-1000", Nuclear Instruments and Methods in Physics Research, Section B, vol. 37/38, No. 2, Feb. 1989, pp. 612-615.
Wilson et al., "Ion Beams... Ion Implantation", Robert E. Krieger Publishing Company, 1973.
Ishikawa, "Ion Source Engineering", no translation.

Primary Examiner—Bruce C. Anderson
Attorney, Agent, or Firm—Leydig, Voit & Mayer

[57] ABSTRACT

An ion implantation apparatus includes an ion source having an arc chamber generating ions and a drawing electrode drawing ions from the arc chamber, a mass separator transporting only ions desired for implantation, an ion implantation chamber in which the material to be implanted by ions is placed, and a controller means for automatically controlling the distance between the arc chamber and the drawing electrode incrementally in accordance with a theoretical calculation using normalized perveance considering the kind of ions to be implanted, the accelerating voltage, and the ion current and current density distribution.

5 Claims, 14 Drawing Sheets

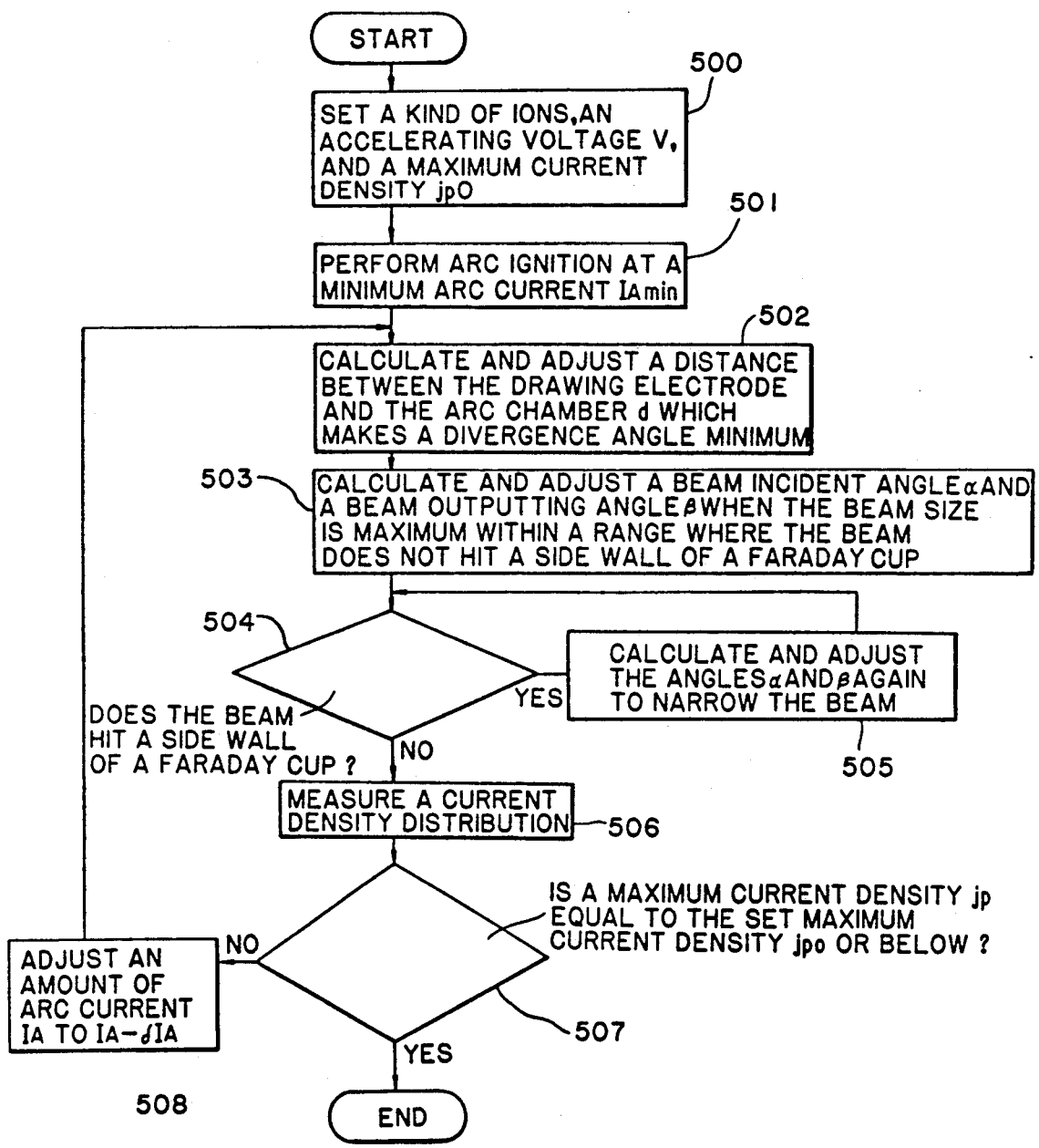

FIG.6(a)
TWO-DIMENSIONAL CURRENT DENSITY DISTRIBUTION
(CONTOUR MAP)
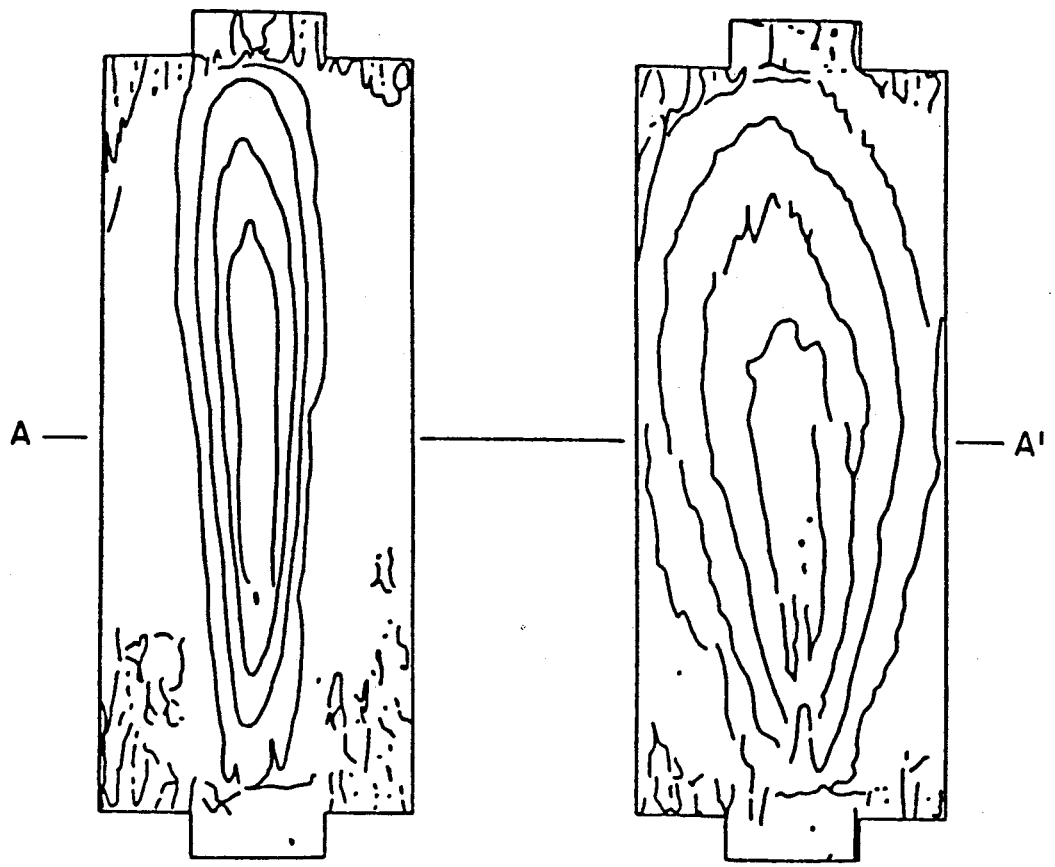
FIG.6(b)
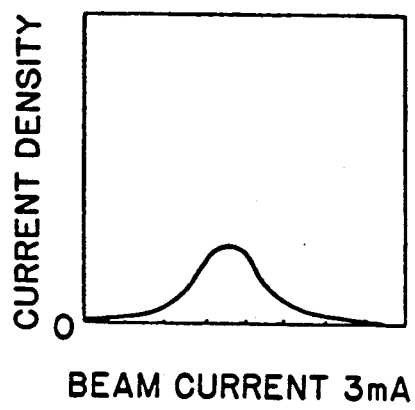
BEAM CURRENT 3mA
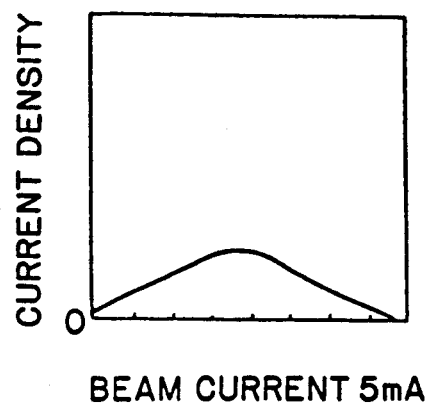
BEAM CURRENT 5mA

ARC CURRENT = CONSTANT

DISTANCE BETWEEN THE ARC CHAMBER
AND THE DRAWING ELECTRODE (d)

DISC SCANNING DIRECTION

ION IMPLANTATION APPARATUS

FIELD OF THE INVENTION

The present invention relates to an ion implantation apparatus which is used when a semiconductor or the like is manufactured.

BACKGROUND OF THE INVENTION

FIG. 15 is a diagram showing an example of a conventional ion implantation apparatus disclosed in, for example Japanese Published Patent Application No. 62-241247. In FIG. 15, an ion beam 22 is applied to an ion implantation chamber 21 and corrected by an ion beam correcting lens 27. Thereafter, the corrected ion beam 22 passes through an ion beam measuring means 33 which functions as a sensor of a controller 32 for controlling the ion beam correcting lens 27. Then, the ion beam 22 passes through a Faraday cage 34 and is implanted in a disk 24 arranged on a rotary disc 23. This rotary disc 23 is connected to an ion beam ampere meter 26.

Then, operation thereof will be described in detail hereinafter.

The ion beam 22 is applied from the left side of FIG. 15 to the ion implantation chamber 21 and then implanted in the wafer 24 arranged on the rotary disc 23. The disc 23 serves as a bottom of the Faraday cage 34 and the amount of the ion beam applied to the Faraday cage 34 can be measured by the ion beam ampere meter 26 connected to the disc 23. The ion beam 22 passes through the ion beam correcting lens 27 and the ion beam measuring means 33 just before it reaches the Faraday cage 34.

FIG. 16 is a view showing the ion beam measuring means 33 seen from the side of the wafer 24. Referring to FIG. 16, a probe 29 formed of a high melting point metal is driven by a motor 40 so as to be rotated through an appropriate angle and vertically crosses the ion beam 22, whereby a current flows through the ampere meter 41. A potentiometer and a rotary encoder are attached to the motor 40 and then a signal obtained by the ampere meter 41 is monitored with an oscilloscope with appropriate synchronization, with the result that waveform shown in FIG. 17 is obtained. Thus, a vertical length, a position, and an approximate configuration of the ion beam can be obtained from the waveform and positions a and b in FIG. 17. The computer 32 receives this information and controls the ion beam correcting lens 27, whereby the ion beam 22 is corrected.

However, since the ion beam correcting lens 27 is inserted in front of the rotary disc 23 in the above conventional ion implantation apparatus, the size of the apparatus is increased and the structure thereof becomes complicated, with the result that production cost is increased. In addition, when the beam correcting lens 27 is inserted, the beam transporting distance is increased, so that the number of ions which collide with neutral particles and scatter is increased. As a result, transporting efficiency of the beam is reduced. In order to prevent it, the correcting lens has to be dispensed with so that the transporting distance of the beam may be short, particularly in a large current type ion implantation apparatus which relies on the transporting efficiency of the beam, like a predeposition type ion implantation apparatus (disclosed in, for example "Electron and Ion Beam Handbook") which is the main current present. However, if there is no ion beam correcting lens, it is difficult to appropriately control the current and current density of the ion beam.

SUMMARY OF THE INVENTION

The present invention was made to solve the above problems and it is an object of the present invention to provide an ion implantation apparatus automatically controlling the amount of current and the current density distribution of an ion beam in a simple structure having no ion beam correcting lens without reducing transporting efficiency of the ion beam.

It is another object of the present invention to provide an ion implantation apparatus automatically controlling the current density distribution of a beam even if the ion implantation apparatus does not have an apparatus for measuring an ion beam current density distribution.

It is a further object of the present invention to provide an ion implantation apparatus controlling a beam with high precision in the horizontal and vertical directions at the same time.

It is still another object of the present invention to provide an ion implantation apparatus controlling a beam with due regard reduction of the electrostatic breakdown coefficient of an element and improvement of productivity at the same time.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

An ion implantation apparatus in accordance with the present invention comprises a drawing electrode control mechanism automatically adjusting a position of a beam drawing electrode. Thus, the amount of current and the current density distribution of an ion beam can be controlled by adjusting the distance between an arc chamber and the beam drawing electrode either by calculation of the perveance or by feedback of the measured result.

In addition, an ion implantation apparatus in accordance with the present invention comprises a mechanism automatically controlling angles of a magnetic pole tip on the beam input and output sides of a mass separator. Thus, both incident angle and outputting angle of the mass separator are automatically controlled incrementally in accordance with a theoretical calculation or feedback of a measured result.

In addition, an ion implantation apparatus in accordance with the present invention performs feedback control by using an apparatus for measuring an ion current density distribution so that a maximum amount of an implantation current which does not exceed a set maximum current density may be obtained.

Thus, according to the present invention, since the amount of current and the current density distribution of an ion beam are controlled by adjusting the distance between an arc chamber and a beam drawing electrode, an ion beam correcting lens is dispensed with and then the apparatus is simplified and beam transporting efficiency is not reduced. Furthermore, it is possible to control a beam in reference to the normalized perveance at a beam drawing part by automatically controlling the position of the beam drawing electrode.

Thus, when the above control is performed by quantization in accordance with a theoretical calculation of perveance, it is possible to control the ion beam even in an ion implantation apparatus which has no beam current density distribution measuring apparatus or only has a simple measuring apparatus. If the ion implantation apparatus comprises the beam current density distribution measuring apparatus, the beam can be controlled with higher precision.

In addition, according to the present invention, since an incident angle and an outputting angle of a mass separator are both automatically controlled by quantization in accordance with a theoretical calculation or a measured result, the distribution of the beam in the vertical and horizontal directions is controlled, with the result that a desired beam size is obtained on a wafer with high precision.

Furthermore, according to the present invention, since feedback control using the ion current density distribution measuring apparatus is performed so that a maximum amount of implantation current which does not exceed a set maximum current density may be obtained, it is possible to control the ion beam with high productivity and yield (low electrostatic breakdown coefficient).

BRIEF DESCRIPTION OF THE DRAWINGS

FIG. 6(A-B) is a view showing the correlation between an amount of implantation current and a current density distribution;

DETAILED DESCRIPTION OF THE PREFERRED EMBODIMENT

Embodiments of the present invention will be described in detail in reference to the drawings hereinafter.

Figure 1:
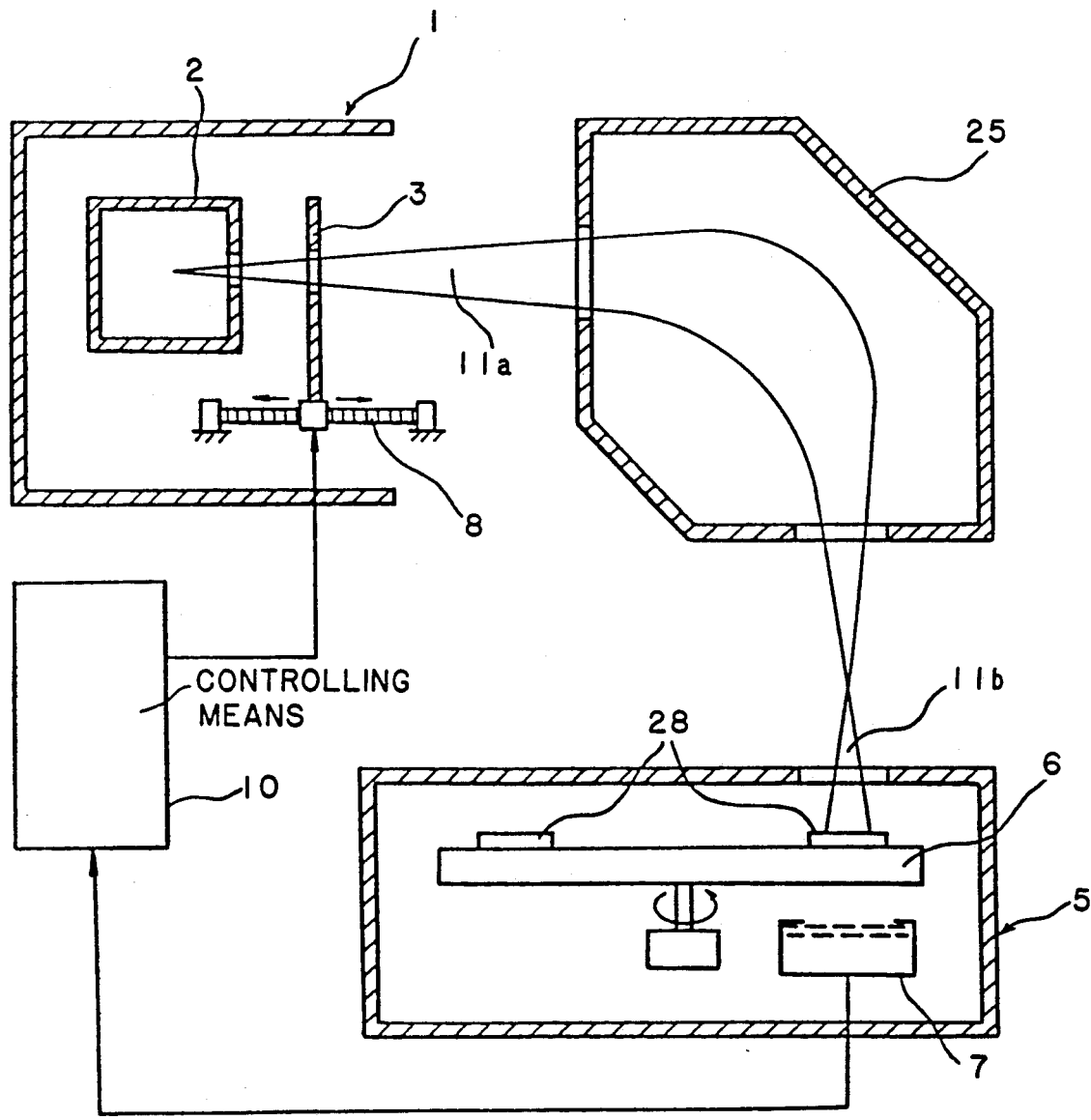
FIG. 1 is a view showing a structure of an ion implantation apparatus in accordance with a first embodiment of the present invention.

FIG. 1 is a view showing a structure of an ion implantation apparatus in accordance with a first embodiment of the present invention. In FIG. 1, an ion source 1 comprises an arc chamber 2 generating ions and a drawing electrode 3 drawing ions from the arc chamber 2. A mass separator 25 produces an ion beam 11b having desired ions from an ion beam 11a drawn by a drawing electrode 3. The ion beam 11b is applied to an ion implantation chamber 5. A rotary disc 6 is provided in the ion implantation chamber 5 and wafers 28 are put on the rotary disc 6. An ion beam measuring means 7 is provided at the lower part of the rotary disc 6. A controlling means 10 controls a drawing electrode driving means 8 in accordance with data obtained by the ion beam measuring means 7.

Then, operation thereof will be described in detail hereinafter.

Ions generated from the arc chamber 2 in the ion source 1 are drawn by the beam drawing electrode 3 and then radiated as an ion beam 11a. The ion beam 11a passes through a mass separator 25 and then an ion beam 11b having required ions only is applied to the ion implantation chamber 5. The ions applied to the ion implantation chamber 5 are implanted in the wafers 28 put on the rotary disc 6 in the ion implantation chamber 5.

The ion beam measuring means 7 for measuring the amount of current and the current density distribution of the ion beam is provided at the lower part of the rotary disc 6 corresponding to the position to which the ion beam 11b is applied. Data obtained by the ion beam measuring means 7 is received and processed by the controlling means 10, whereby the drawing electrode driving means 8 is controlled. As a result, the distance between the arc chamber 2 and the drawing electrode 3 is adjusted and the ion beams 11a and 11b are corrected.

Figure 15:
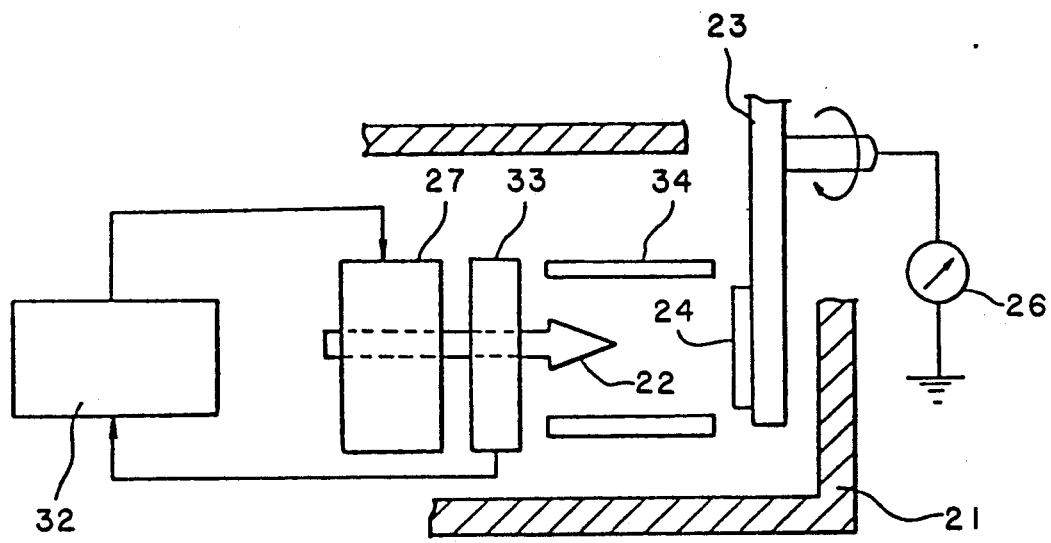
FIG. 15 is a view showing an example of an ion implantation apparatus comprising a conventional ion beam correcting lens
Figure 16:
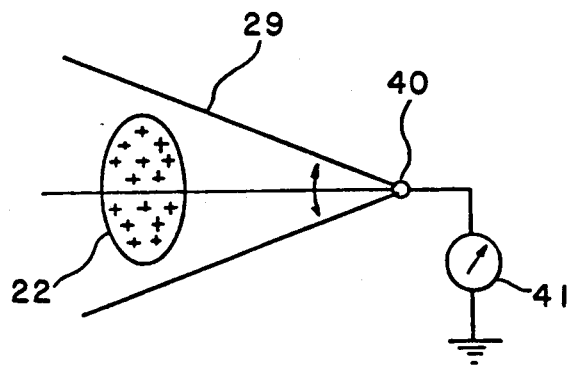
FIG. 16 is a view showing ion beam measuring means of the apparatus in FIG. 15.
Figure 17:
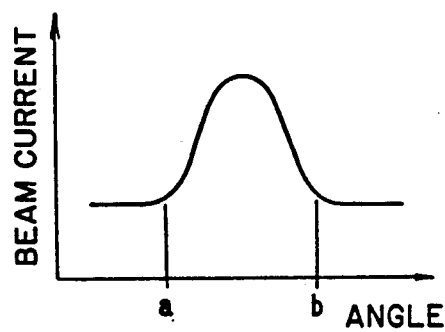
FIG. 17 is a view showing a current density distribution detected by the ion beam measuring means in FIG. 16 and monitored by an oscilloscope.
Figure 4:
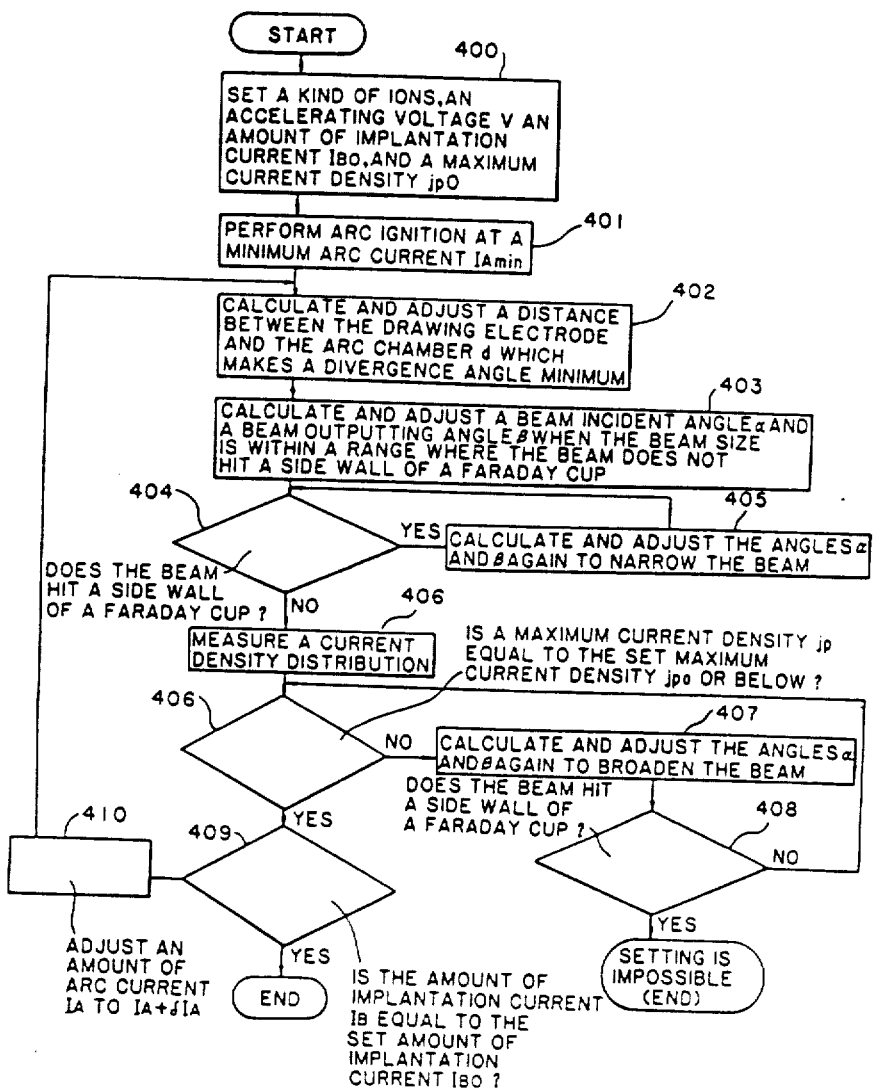

It is considered that the ion beam can be measured with highest precision when, for example a method of scanning an ion beam detector of a multihole Faraday type is used as the ion beam measuring means 7. However, the ion beam measuring means 33 in a conventional apparatus shown in FIG. 15 may be used.

Referring to FIG. 1, the ion beam is drawn out of the arc chamber 2 by the beam drawing electrode 3. Since the ion beam consists of positive electric charges, when the ion density is especially high, the ion beam scatters by repulsive force of ions. This phenomenon is generally called "divergence caused by a space charge of an ion". First, control (a primary control) is performed in disregard of the divergence of beam caused by the space charge. A distance D between a beam drawing electrode 3, which provides a minimum beam divergence angle when the divergence of beam caused by the space charge is not considered, and an arc chamber 2 is found from a theory and a numeral expression described by Junzo Ishikawa, in "Ion Source Engineering", pp.178-186 published by Ionics Kabushiki Kaisha as follows.

$$D = 2\left(\frac{SC_{e0}}{9I}\right)^{\frac{1}{2}} (2\sigma V^3)^{\frac{1}{4}}$$

where S is an area of a drawing hole, C is a constant which is 0.6 when the drawing hole is a circle and 0.68 when it is a slit, $\epsilon_0$ is a dielectric constant of a vacuum, $\sigma$ is an effective specific charge, I is a drawing current and V is a drawing voltage.

The above effective specific charge $\sigma$ is expressed as follows.

$$\sigma \cdot {}^{\frac{1}{2}}I = \Sigma_i \left(\frac{m_i}{z_i e}\right)^{\frac{1}{2}} I_i$$

where $m_i$, $Z_i$ and $I_i$ are mass, ionization number and the amount of current of each ion comprised in I respectively and e is the electronic charge.

S and C in the above equation are constants decided depending on each apparatus and V and I are set as implantation conditions. If $\sigma$ in accordance with I is obtained by an experiment or the like, controlling means 10 calculates a value of D by several arithmetic operations and the position of the beam drawing electrode 3 is adjusted by driving means 8, whereby the beam drawing operation when the divergence caused by the space charge can be disregarded can be implemented with the best convergence. The above is the primary control.

In addition, $\sigma$ can be easily found by an experiment using a mass separator 25.

The drawn ion beam passes through the mass separator 25, whereby a beam having only desired ions is only separated obtained. Thereafter, it is applied to the wafer 28 on the rotary disc 6 arranged in the ion implantation chamber 5. The ion beam measuring means 7 measures the amount of current and the current density distribution of the beam radiated on the wafer 28. At this time, if divergence of the beam caused by the space charge can be disregarded, the measured amount of current shows a maximum value.

However, when an effect of the space charge can not be disregarded and the amount of current is not maximum or when there is considerable variation in the current density even if the amount of current is maximum and this variation should be corrected, the following more precise control, that is, a secondary control is performed as follows.

Figure 11:
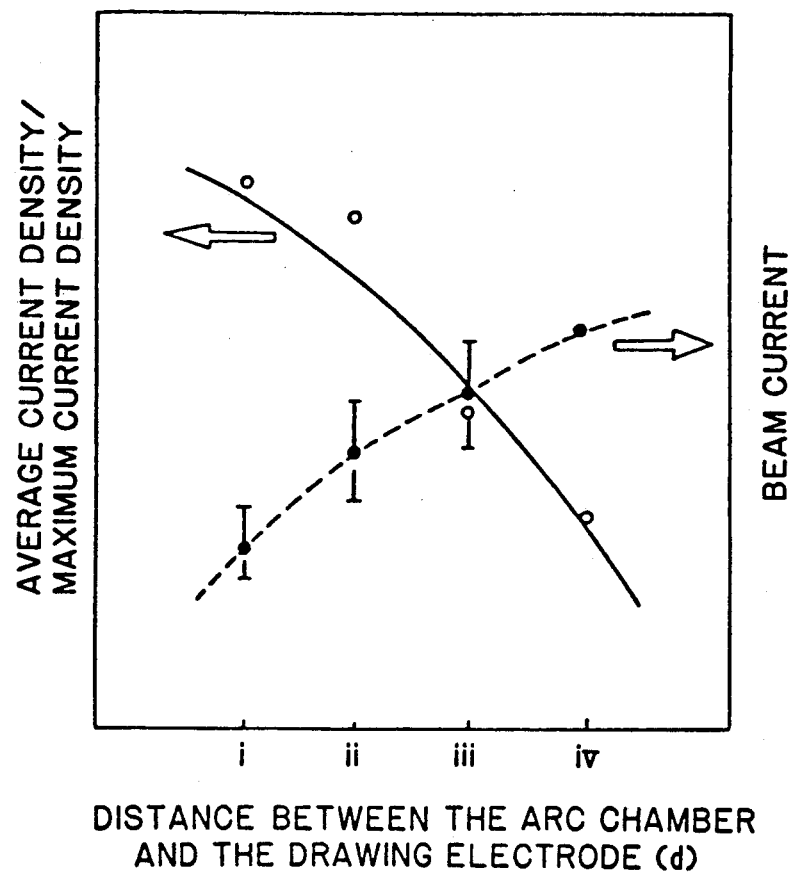
FIG. 11 is a view showing the relation between a distance d between an arc chamber and a beam drawing electrode, a current and a current density distribution of a beam in the second embodiment of the present invention.
Figure 12:
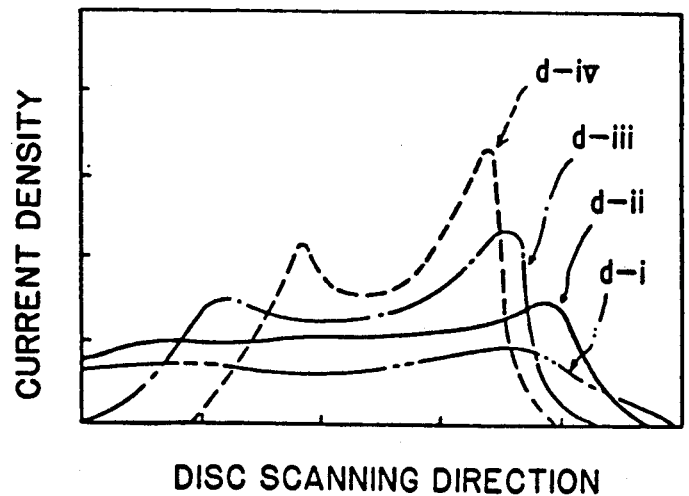
FIG. 12 is a view showing an accumulated beam current distribution in the disc scanning direction when d is i through iv.

FIG. 11 is a graph showing d (the distance between the arc chamber and the drawing electrode) dependency of the amount of current and the current density distribution of an ion beam which are measured by the ion beam measuring means 7. The horizontal axis in FIG. 11 shows that d is increased at equal intervals in the order of i, ii, iii and iv. FIG. 12 shows a current density distribution of an accumulated beam in the disc scanning direction at each position of i through iv. As can be seen from FIGS. 11 and 2, variation of d has the same effect on the beam as that of a convergent lens. Therefore, when the value of d is varied and the controlling means 10 performs feedback control, the amount of current measured by the ion beam measuring means 7 may be maximized. In addition, when the current density distribution is made uniform, the value of d is varied and the controlling means 10 performs feedback control while monitoring the current density distribution of the ion beam measuring means 7. As a monitoring parameter at this time, for example a value of a maximum current density or maximum current density / average current density is set and then a maximum amount of current which does not exceed that set value can be obtained by the controlling means 10.

As described above, since the ion beam can be adjusted without the ion beam correcting lens, the beam transporting distance is not increased. Therefore, the amount of current and the current density distribution of the ion beam can be automatically controlled, while the beam transporting efficiency is not reduced.

Published Patent application above control can be applied to a serial control in which continuous control is implemented in real time or to batch process in which an ion beam is adjusted at appropriate intervals of time.

Although the above control is performed by monitoring the ion beam after mass separation, the beam before the mass separation may be monitored. At this time, especially when the current density distribution is controlled, it is necessary to previously correlate the current density distributions of the ion beam before and after the mass separation by calculation or the like.

Figure 9:
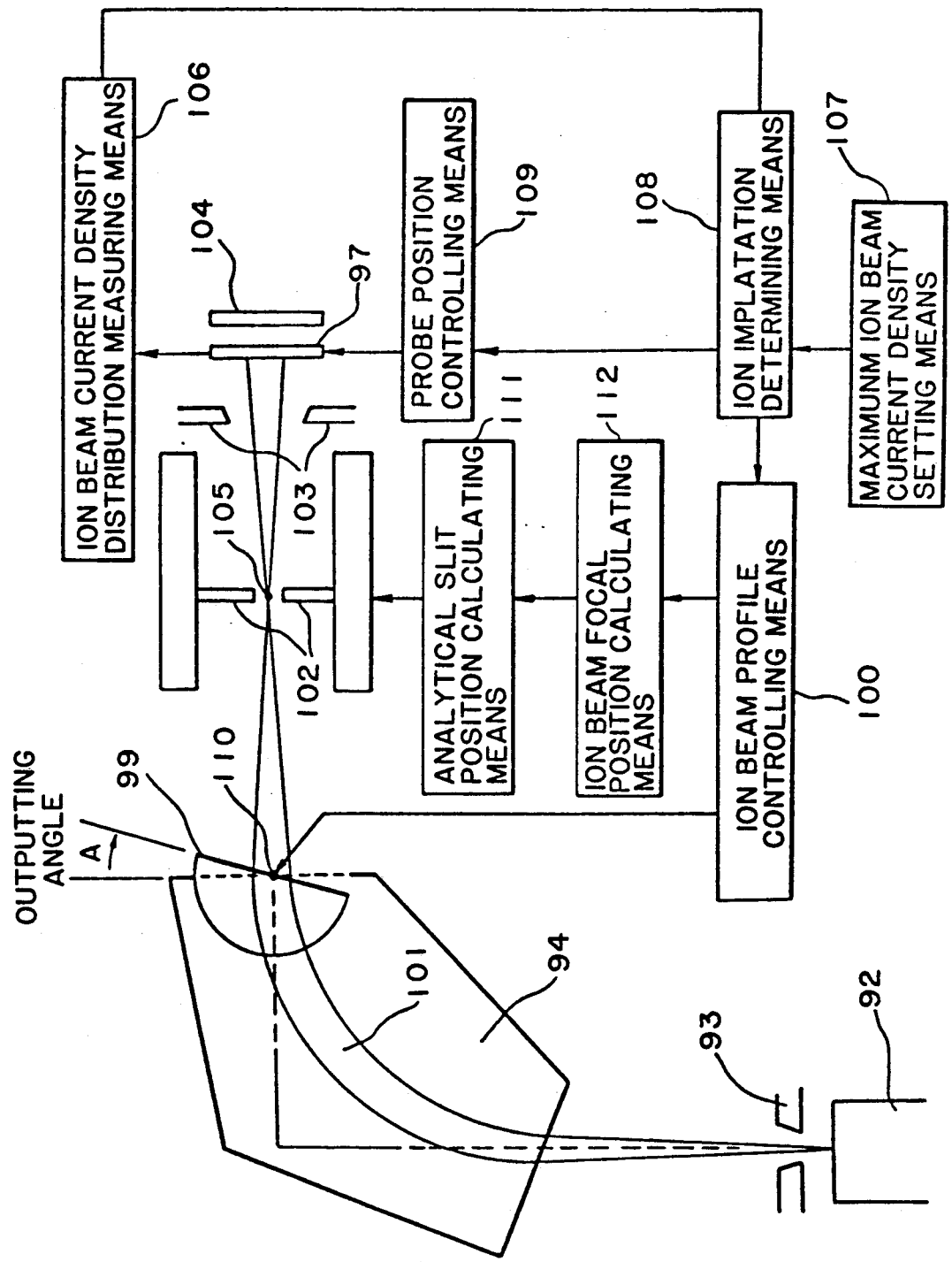
FIG. 9 is a view showing an example of an ion implantation apparatus comprising a conventional mass separator.

FIG. 9 is a view showing a conventional ion implantation apparatus disclosed in, for example Japanese Published Patent Application 62-243231. In FIG. 9, an ion beam 101 is drawn from an ion source arc chamber (ion source) 92 by a drawing electrode 93. Then, an advancing direction of the ion beam 101 is curved by a mass separator (analyzer magnet) 94 and an outputting angle thereof is varied by a pole tip 99. The outputted ion beam 101 passes through a movable analytical slit 102 and a molding slit (mask) 103 and reaches an ion beam current density measuring apparatus (probe) 97 and a wafer 104. An ion beam current density distribution measuring means 106 measures the ion beam current density using the probe 97. An ion implantation determining means 108 determines whether ion implantation can be performed or not in accordance with a value of the ion beam current density and a value of maximum ion beam current density measured by a maximum ion beam current density measuring means 107. When the result is that implantation can be performed, a probe position controlling means 109 controls a position of the probe 97. When the result is that implantation cannot be performed, an ion beam profile controlling means 100 controls the angle of the pole tip 99 and an ion beam focal position calculating means 112 calculates a focal position of the ion beam. Then, an analytical slit position controlling means 111 varies a position of an analytical slit 102 in accordance with the calculation result.

Next, operation thereof will be described in detail hereinafter.

The ion source 92 generates plasma of impurity ions and the drawing electrode 93 draws the ion beam 101 from the plasma. The analyzer magnet 94 generates a magnetic field in the direction perpendicular to the ion beam 101 and curves the advancing direction of the ion beam 101. The pole tip 99 varies an outputting angle A of the ion beam 101 around the rotation axis 110 of the pole tip. The position of the focal point 105 of the ion beam approaches or retreats from the analyzer magnet 94 by this variation of the outputting angle A. The analytical slit 102 analyzes the ion beam 101 and increases the purity of the ion beam 101. The mask 103 prevents the ion beam 101 from spreading beyond necessity. The probe 97 receives the ion beam 101 before ion implantation is performed on the semiconductor wafer 104 on which an MOS-IC or the like is formed and the ion beam current density distribution is measured by the ion beam current density distribution measuring means 106. A maximum ion beam current density is set by the maximum ion beam current density setting means 107 and this value and the measured value are compared by the ion implantation determining means 108. When the result indicates that implantation can be performed, the position of the probe 97, controlled by the probe position controlling means 109, is changed to complete measurement of the current density distribution. On the other hand, when the result indicates that implantation can not be performed, the ion beam profile controlling means 100 moves the pole tip 99.

As described above, the ion beam maximum current density distribution is controlled so that yield is prevented from being reduced by electrostatic breakdown.

However, it is not possible to apply the controlling method for the conventional apparatus to an ion implantation apparatus which does not have the beam current density distribution measuring apparatus. In addition, since the profile of the beam is controlled only by the beam outputting angle of the mass separator, control of the vertical or horizontal direction of the beam is achieved, so that it is not possible to automatically control the beam in the horizontal and vertical directions at the same time. Furthermore, although an electrostatic breakdown coefficient depends on the maximum current density and productivity depends on an amount of implantation current, the above control only controls the maximum current density. More specifically, the control gives consideration only to the electrostatic breakdown and productivity is not regarded because a beam may have a different amount of current with almost the same maximum current density in some cases, such as are shown in FIG. 6(A,B). FIG. 6(a) shows a two-dimensional current density distribution and FIG. 6(b) shows a current density distribution of a section taken along a line A—A' in FIG. 6(a).

Figure 10:
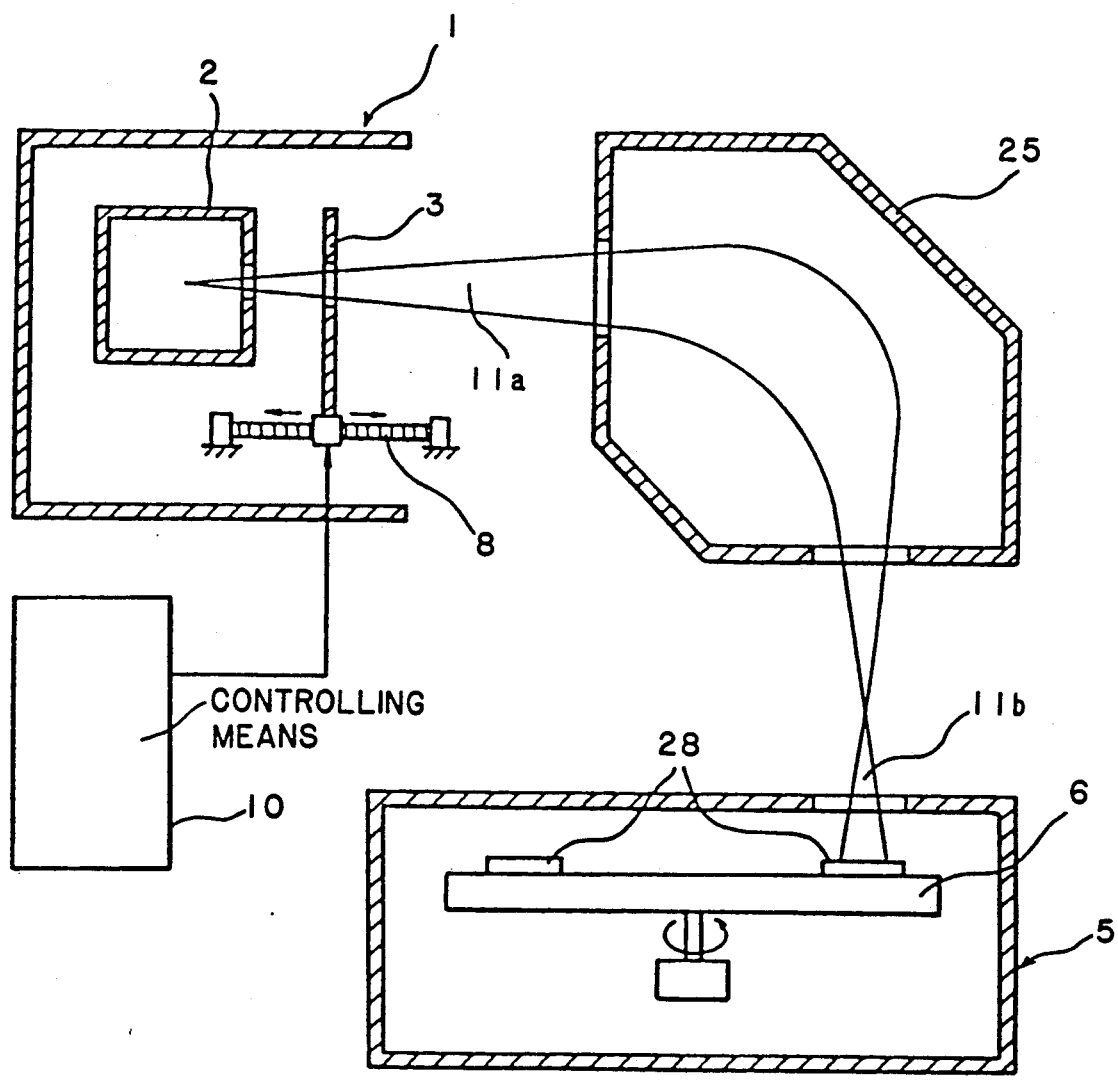
FIG. 10 is a view showing a structure of an ion implantation apparatus in accordance with a second embodiment of the present invention.

FIG. 10 is the view showing a structure of an ion implantation apparatus in accordance with a second embodiment of the present invention. In FIG. 10, the same references designate the same parts or in FIG. 1. A controlling means 10 controls the distance between the arc chamber 2 and the drawing electrode 3 by quantization in accordance with a theoretical calculation of normalized perveance at a beam drawing part.

Then, operation thereof will be described in detail hereinafter.

Referring to FIG. 10, the ion beam 11a is drawn by the drawing electrode 3 from plasma generated by the arc chamber 2. The drawn beam 11 passes through the mass separator 25 and then the beam 11b of required ions is separated. Then, the beam is introduced into the ion implantation chamber 5 and irradiates the wafer 28 arranged on the rotary disc 6.

As shown in the above "Ion Source Engineering", pp. 183-186, the angle of divergence $\omega$ of the outermost particle at a position of the drawing electrode is represented by the following equation in a primary approximation when space charge can be disregarded.

(i) Single hole electrode $$\omega = \frac{1}{4} \frac{2a}{d} \left| 1 - \frac{5}{3} \frac{P}{Pc} \right|$$

where $2a$ is the length of an opening for drawing a beam and d is the distance between the arc chamber and the drawing electrode.

(ii) Slit electrode or the like $$\omega = \frac{17}{12} \frac{a}{d} \left| 1 - \frac{25}{17} \frac{p}{Pc} \right|$$

where P is actual perveance at a beam drawing part, which is represented by the following equation.

$$P = I_{EX}/V^{3/2}$$

where $I_{EX}$ is a drawing current and V is an accelerating (drawing) voltage.

In addition, Pc the perveance at the beam drawing part obtained by a plane, parallel plate approximate calculation, which is represented by the following equation.

$$Pc \approx \frac{\epsilon_0}{9} \frac{S}{d^2} \left( \frac{2Ze}{m_i} \right)^{\frac{1}{2}}$$

where $\epsilon_0$ is the dielectric constant of a vacuum, S is the opening area at the beam drawing part, Z is the ionization number, e is the electronic charge and $m_i$ is mass of an ion. (In the above-described first embodiment, the distance D which provides a minimum beam divergence angle is obtained from the value of P/Pc when $\omega$ is 0 in the above equation.)

In addition, the relationship between the beam divergence angle $\omega$ and initial velocities of the beam in x and y directions $x_0'$ and $y_0'$ are as follows.

$$\begin{cases} x_0' = \tan\omega_x \\ y_0' = \tan\omega_y \end{cases}$$

Therefore, when the position of the drawing electrode 3 and the normalized perveance P/Pc at the beam drawing part are found, the beam divergence angle $\omega$ is found. When the position and ω are found, the beam size on a wafer can be calculated, so that it is possible to control the beam size on the wafer by controlling the value of P/Pc. However, the above calculation can not be applied in some cases because of differences in conditions of a drawing system such as the configuration of the drawing electrode in the actual ion implantation apparatus. In this case, fP/Pc where the factor f is peculiar to particular apparatus may be used. It is found from the equation of P and Pc that P/Pc is varied when $I_{EX}$, V and d are varied. However, V is fixed at a constant value if a depth of implantation or the like is specified from the process side. Meanwhile, $I_{EX}$ is closely related to the amount of the implantation current. The amount of the implantation current is desirably controlled so that $I_{EX}$ can be used for controlling the amount of the implantation current. Therefore, the value of d may be used for controlling P/Pc. For example, as can be seen from FIG. 7, it is found that when the arc current is constant in the ion implantation apparatus and d varies from 8 mm to 14 mm, P/Pc varies within the range 0.22 to 0.68, while the value of $I_{EX}$ is almost constant. The reason for this is that the plasma density is constant as long as the arc current is constant. In addition, it can be seen from FIG. 8 that the beam profile is almost the same as long as the value of P/Pc is the same even if $I_{EX}$ is different (it is considered that a difference in beam distribution due to the amount of current is caused by a space charge effect after the beam is drawn). Therefore, if the desired size of the beam on the wafer is set, the value of d is calculated by the calculating and controlling means 35 in accordance with the measured value of the amount of the drawing current or the like. Then, it is possible to control the beam 11 by moving the drawing electrode driving mechanism 8.

Figure 2:
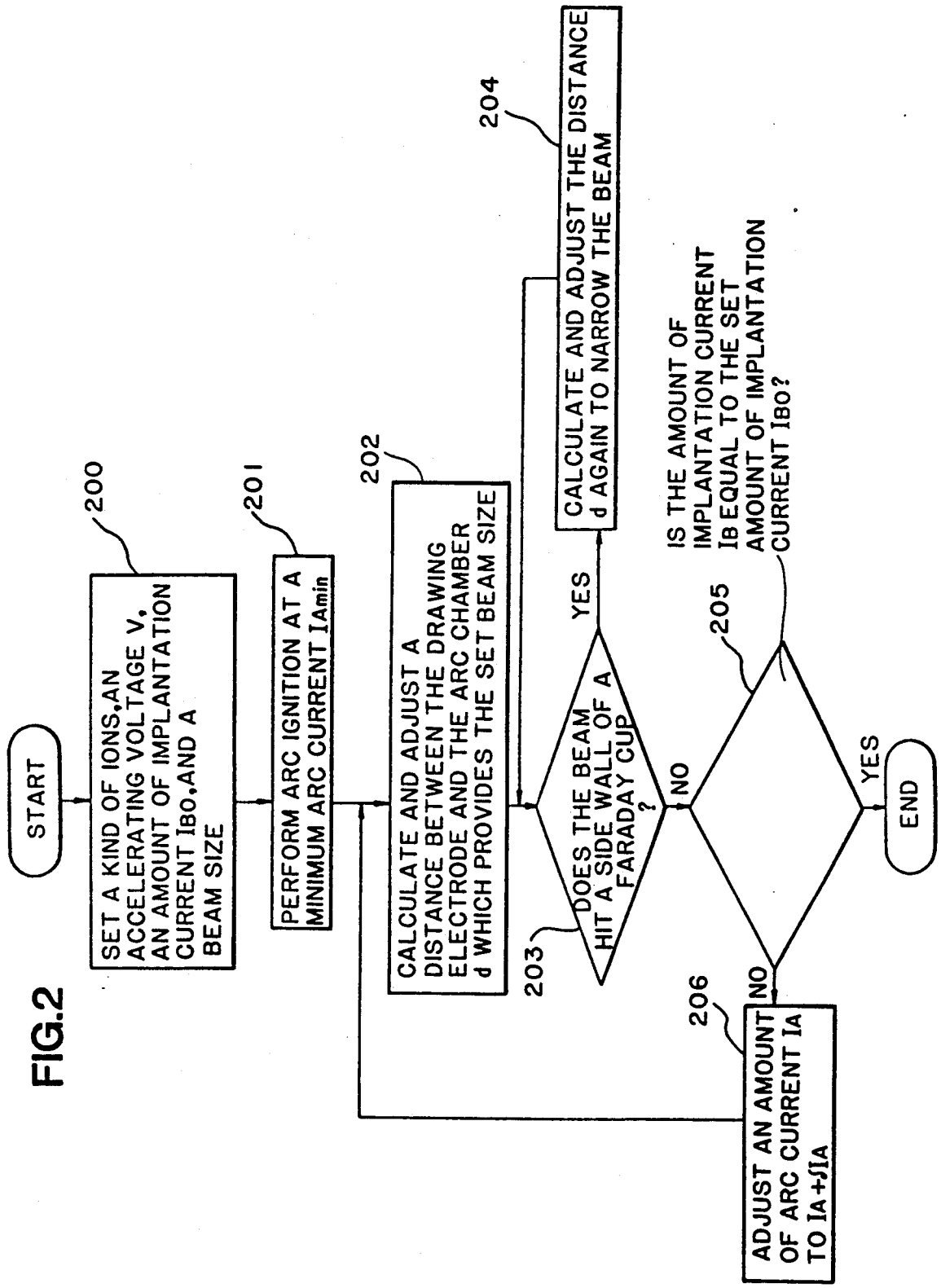
FIG. 2 is a view showing an example of a control algorithm for controlling an ion beam by adjusting the distance between an arc chamber and a beam drawing electrode in accordance with a theoretical calculation using normalized perveance at a beam drawing part.

FIG. 2 shows an example of control algorithm.

First, a kind of ions, an accelerating voltage V, an implantation current $I_{BO}$, and a beam size are set (200) and arc ignition is performed at a minimum arc current $I_{Amin}$ (201). Then, the distance between the drawing electrode and the arc chamber d which makes the divergence angle a minimum is calculated and adjusted (202). If the ion beam hits a side wall of a Faraday cup, the distance d is repeatedly calculated and adjusted to narrow the beam until a beam which does not hit the side wall of the Faraday cup is obtained (203, 204). When the implantation current $I_{BO}$ is not equal to the set implantation current $I_{BO}$ (205), the arc current $I_A$ is adjusted to $I_A + \delta I_A$ (206), and the process returns to step 202. The processing from 202 is repeated until the implantation current $I_B$ becomes equal to the set implantation current $I_{BO}$.

Meanwhile, the beam divergence angle when the beam is drawn is controlled in the first embodiment and a phase coordinate of the beam on the wafer in the beam transporting system in this embodiment is found as follows using the matrix representation shown in "ION BEAMS with application to ion implantation" pp.207-213).

$$\begin{pmatrix} x \\ x' \end{pmatrix} = (M_{L2})(M_{e2X})(M_{magX})(M_{e1X})(M_{L1})\begin{pmatrix} x_0 \\ x_0' \end{pmatrix} \quad (1)$$

$$\begin{pmatrix} y \\ y' \end{pmatrix} = (M_{L2})(M_{e2Y})(M_{magY})(M_{e1Y})(M_{L1})\begin{pmatrix} y_0 \\ y_0' \end{pmatrix}$$

-continued $$\left.\begin{matrix}(x_0\ x_0')\\(y_0\ y_0')\end{matrix}\right\} \ldots \text{Initial phase coordinate}$$

x: Horizontal direction
y: Vertical direction where (M) is a transfer matrix at each part and each of them is represented as follows.

$$(M_{L2}) = \begin{pmatrix} 1 & L2 \\ 0 & 1 \end{pmatrix};$$

a straight line from an analytical electromagnet outlet to a wafer and L2 is the distance between them.

$$(M_{e2X}) = \begin{pmatrix} 1 & 0 \\ -\tan\beta/\rho & 1 \end{pmatrix};$$

caused by an effect of an end part of the analytical electromagnet outlet and β is a beam outputting angle.

$$(M_{magX}) = \begin{pmatrix} \cos\phi & \rho\sin\phi \\ -\sin\phi/\rho & \cos\phi \end{pmatrix};$$

an analytical electromagnet $$(M_{e1X}) = \begin{pmatrix} 1 & 0 \\ -\tan\alpha/\rho & 1 \end{pmatrix};$$

caused by an effect of an end part of an analytical electromagnet inlet and α is a beam incident angle.

$$(M_{L1}) = \begin{pmatrix} 1 & L1 \\ 0 & 1 \end{pmatrix};$$

a straight line from an ion source to the analytical electromagnet inlet and L1 is the distance between them.

$$(M_{02Y}) = \begin{pmatrix} 1 & 0 \\ \tan\beta/\rho & 1 \end{pmatrix};$$

caused by an effect of an end part of an analytical electromagnet outlet.

$$(M_{magY}) = \begin{pmatrix} 1 & \rho\phi \\ 0 & 1 \end{pmatrix};$$

an analytical electromagnet $$(M_{01}\gamma) = \begin{pmatrix} 1 & 0 \\ \tan\alpha/\rho & 1 \end{pmatrix};$$

caused by an effect of an analytical electromagnet inlet and $\rho$ is a radius of curvature and $\phi$ is an angle of polarization.

Therefore, the size of the beam on the wafer can be obtained by calculating the outermost path of a desired kind of ions among particles forming the ion beam using the above equations.

More specifically, it is also possible to control a value of (x, y, x', y') by varying the incident angle and the outputting angle of the mass separator 25 in accordance with the above equation (1).

Figure 13:
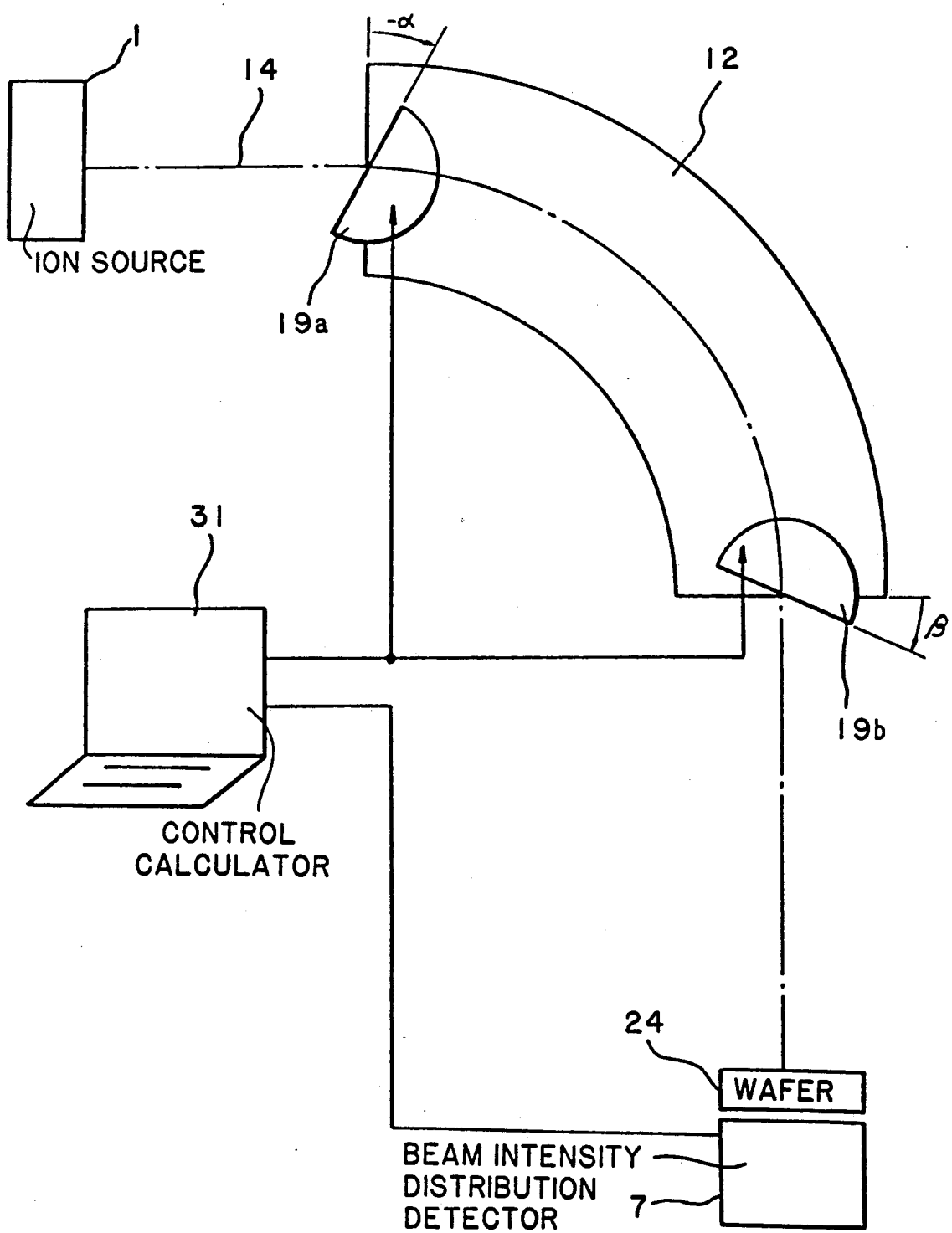
FIG. 13 is a view showing a control structure of a mass separator of an ion implantation apparatus in accordance with a third embodiment of the present invention.

FIG. 13 is a view showing a control structure of a mass separator in an ion implantation apparatus in accordance with a third embodiment of the present invention. In FIG. 13, an ion beam is output from an ion source 1 and the axis thereof is curved by a mass analytical electromagnet 12. Then, the ion beam reaches a wafer 24 and a beam intensity distribution detector 7. A control calculator 31 controls an incident variable angle magnetic pole and an output variable angle magnetic pole of the mass analytical electromagnet 12 in accordance with an output of the beam intensity distribution detector 7.

Then, operation thereof will be described in detail hereinafter.

The ion implantation apparatus is variously used. For example, when a semiconductor device is manufactured, the apparatus is used to implant dopant atoms by. The kinds of ions implanted in the wafer are boron (B), arsenic (As) or the like. For example, when boron is implanted, first, boron is introduced into the ion source 1, ionized and then drawn with required energy. However, there are unnecessary ions such as $^{10}B$ in addition to necessary ions of $^{11}B$ in the drawn boron beam. Therefore, the necessary ions of $^{11}B$ are separated from the various ions through the mass analytical electromagnet 12 and they reach the wafer. Although the required size of the beam on the wafer is determined by the size of the wafer, when the beam drawn out of the ion source 1 passes through a conventional mass separator, the beam outputting angle is variable but the beam incident angle is fixed, and therefore beam control is performed either in x direction or y direction.

Therefore, the analytical electromagnet 12 in accordance with this embodiment comprises the incident variable angle magnetic pole 19a and the output variable angle magnetic pole 19b which converge the beam in the horizontal and vertical directions and an automatic controller thereof.

References $\alpha$ and $\beta$ correspond to $\alpha$ and $\beta$ which are given in description of the equation which determines the coordinates. In FIG. 13, when the direction of an arrow is $\beta > 0$, x converges and y diverges and when the direction of the arrow is $\alpha < 0$, x diverges and y converges. More specifically, when both are positive, convergent force in the horizontal direction and divergent force in the vertical direction are applied and when they are negative, the reverse forces are applied. Movement of the particles in such a beam transporting system is described above and any beam size on the wafer can be obtained by varying the incident and output angles. Since the incident and output angles are variable in this embodiment, even in a case where a predetermined beam is not obtained or where the kind of ions, the accelerating voltage or the like are changed after the apparatus is manufactured, it is possible to provide a predetermined beam size on the wafer by appropriately varying both incident and output angles As described above, since the values of the incident angle $\alpha$ and the outputting angle $\beta$ are calculated and then the beam can be formed so as to converge both in the x and y directions in this embodiment, it is possible to automatically control the beam with high precision.

In addition, for example, when a divergent angle of the beam before it is applied to the mass separator 4 is controlled to be small as possible by the drawing electrode and the beam is arranged by the incident and outputting angles $\alpha$ and $\beta$ by combining the control in accordance with the third embodiment and the position control of the drawing electrode 3 in accordance with the second embodiment, the beam transporting efficiency is increased and the beam can be controlled with high precision.

Figure 3:
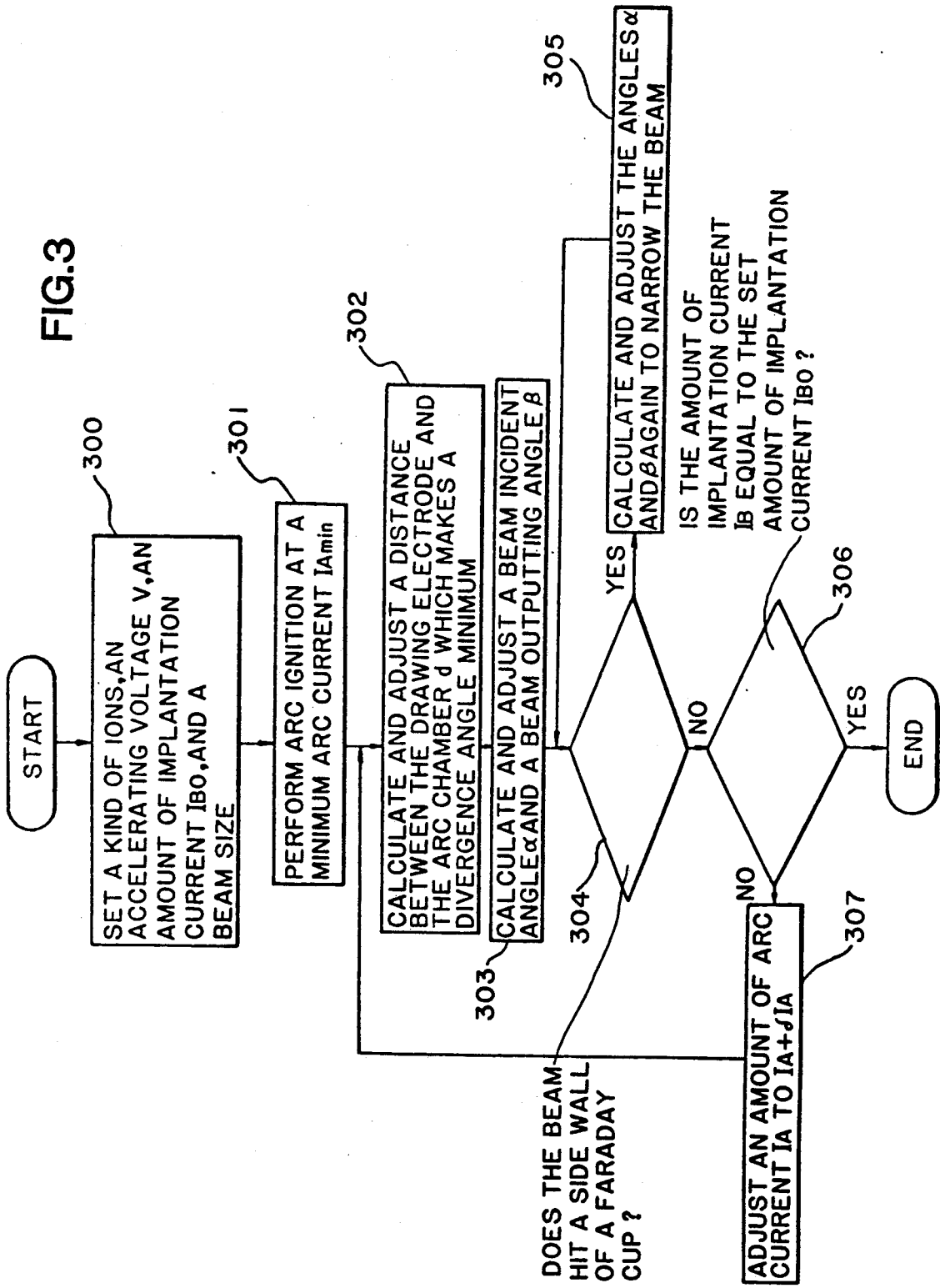
FIG. 3 is a view showing an example of control algorithm for controlling the ion beam by adjusting the distance between the arc chamber and the beam drawing electrode and an incident angle and an outputting angle of a mass separator.

FIG. 3 shows an example of control algorithm in this case.

First, a kind of ions, an accelerating voltage V, an implantation current $I_{BO}$, and a beam size are set (300) and arc ignition is performed at a minimum arc current $I_{Amin}$ (301). Then, the distance between the drawing electrode and the arc chamber d which makes the divergence angle a minimum is calculated and adjusted (302), and a beam incident angle $\alpha$ and a beam outputting angle $\beta$ are calculated and adjusted (303). If the beam hits a side wall of a Faraday cup, the beam incident angle $\alpha$ and the beam outputting angle $\beta$ are repeatedly calculated and adjusted to narrow the beam until a beam which does not hit the side wall of the Faraday cup is obtained (304, 305). When the implantation current $I_B$ is not equal to the set implantation current $I_{BO}$ (306), the arc current $I_A$ is adjusted to $I_A + \delta I_A$ (307), and the process returns to step 302. The processing from 302 is repeated until the implantation current $I_B$ becomes equal to the set implantation current $I_{BO}$.

If the control by the drawing electrode 3 in this case is regarded as the control for drawing a constant beam even if the ion source is varied, the range of control is increased. In addition, even if the control of the drawing electrode 3 and the control of the outputting angle $\beta$ (or the incident angle $\alpha$) are combined, the range of control is increased as compared with the control of the output angle $\beta$ only.

Although the control described in accordance with the second and third embodiments is effective in a case where divergence caused by the effect of the space charge of the beam can be disregarded, if that effect can not be disregarded, it is necessary to use a calculation in which the effect of the space charge is considered. An outline of this calculating method is almost the same as above except that the influence of the space charge effect is approximated by a thin wall lens and taken into that calculation. More specifically, divergent force which is generated by the space charge when the beam advances by a distance 1 is considered to be received in an instant after the beam advances by the distance 1. Therefore, it appears that a lens applying the divergent force in both horizontal and vertical directions is arranged in the beam transporting system at intervals of length 1. When the electric charge density distribution of the beam is uniform, the transfer matrix of the thin wall lens is represented as follows.

$$\begin{pmatrix} 1 & 0 \\ \delta_{x,y} & 1 \end{pmatrix}$$

$$\delta_x = \epsilon \frac{120 eI(1-\eta)}{m_0 c^2 \gamma^3 a(a+b)} l$$

$$\delta_y = \epsilon \frac{120 eI(1-\eta)}{m_0 c^2 \gamma^3 b(a+b)} l$$

where $\epsilon$ is electric charge number/mass number, $\eta$ is neutralization coefficient, $m_0 c^2$ is rest energy of the proton, $\gamma$ is velocity of ion/velocity of light, a is a radius in the horizontal direction when a section of the beam is an ellipse and b is a radius in the vertical direction when the section of the beam is an ellipse.

As can be seen from the above, since the divergent force influenced, by the space charge is related to the beam diameter, the divergent force is applied while the beam diameter is sequentially calculated along the beam orbit in the actual calculation. More specifically, the beam diameter when the beam advances from the ion source by a distance l regardless of an influence of the space charge is found and then the divergent force the space charge is found from that beam diameter using the above representation and then the divergent force is applied to the beam. Then, the same calculation is continued using the consequently changed form of emittance as an initial value. If the neutralization coefficient by electrons of the ion beam is previously found by an experiment or the like, the control can be more accurate.

As described above, the beam size on the wafer can be automatically controlled by the calculation, with the result that the beam current can be automatically controlled. However, when it is necessary to automatically control the current density distribution with higher precision than that of the above automatic control or when a non-linear effect of the beam can not be disregarded, feedback control may be used in accordance with the result measured by the current density distribution measuring apparatus 7.

Figure 4:
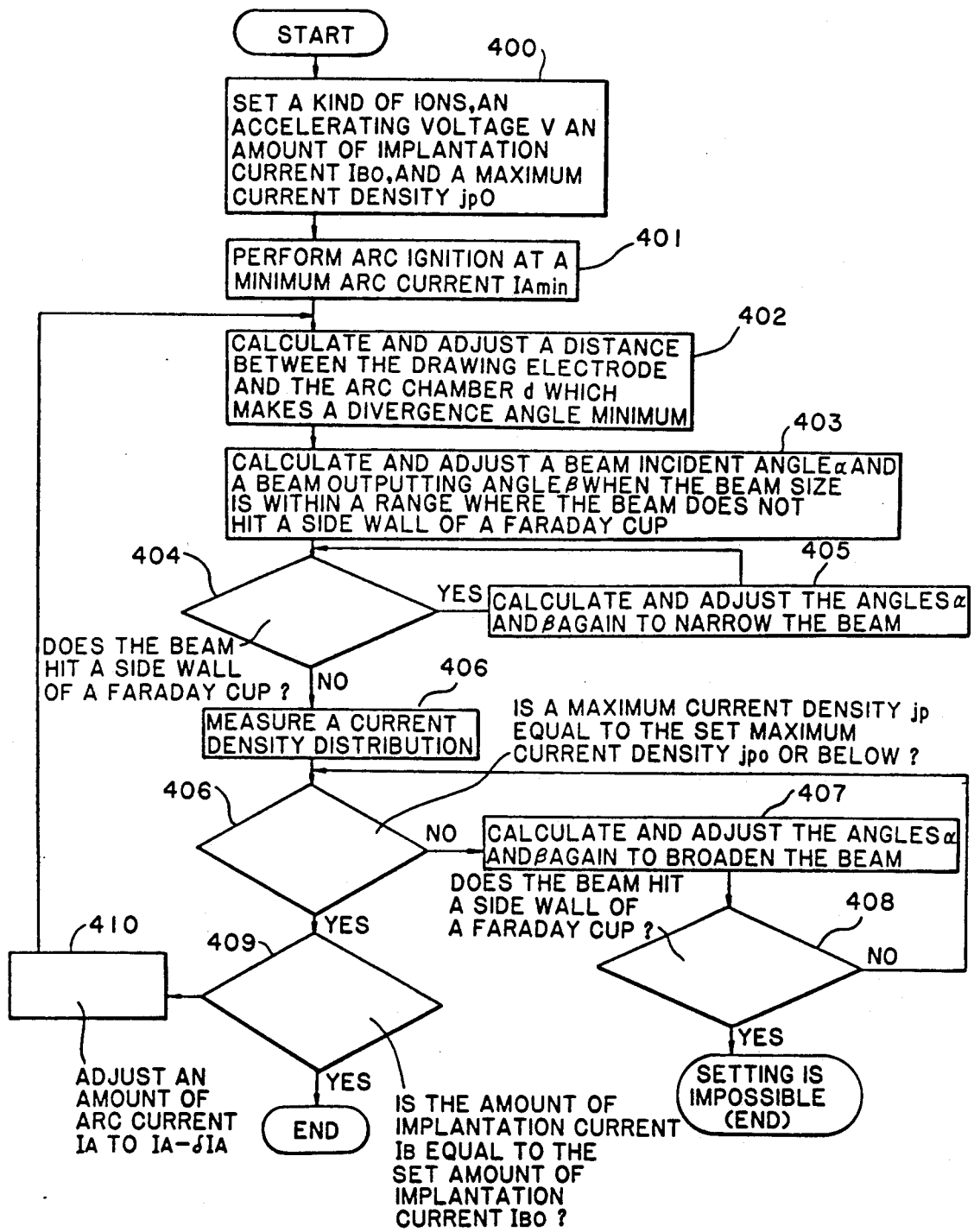
FIG. 4 is a view showing an example of a control algorithm for controlling the ion beam by adjusting the distance between the arc chamber and the beam drawing electrode and the incident angle and the outputting angle of the mass separator in accordance with a theoretical calculation and by performing feedback control using an ion current density distribution measuring apparatus.

FIG. 4 shows an example of control algorithm in this case.

First, a kind of ions, an accelerating voltage V, an implantation current $I_{BO}$, and a maximum current density $j_{p0}$ are set (400) and arc ignition is performed at a minimum arc current $I_{Amin}$ (401). Then, the distance between the drawing electrode and the arc chamber d which makes the divergence angle minimum is calculated and adjusted (402), and a beam incident angle $\alpha$ and a beam outputting angle $\beta$ are calculated and adjusted when the beam size is within a range where the beam does not hit a side wall of a Faraday cup (403). If the beam still hits the side wall of the Faraday cup, the beam incident angle and the beam outputting angle $\alpha$ $\beta$ are repeatedly calculated and adjusted to narrow the beam until a beam which does not hit the side wall of the Faraday cup is obtained (404, 405). Then, the current density distribution is measured (406), and when the maximum current density $j_p$ is higher than the set maximum current density $j_{p0}$, the beam incident angle $\alpha$ and the beam output angle $\beta$ are again calculated and adjusted to broaden the beam (407). If the beam still hits the side wall of the Faraday cup (408), it is judged that the setting is impossible and then the processing is concluded. When the maximum current density $j_p$ is equal to the set maximum current density $j_{p0}$ or below (406) and the implantation current $I_B$ is not equal to the set implantation current $I_{BO}$ (409), the amount of the arc current IA is adjusted to $I_A - \delta I_A$ (410), and the process returns to step 402. The processing from 402 is repeated until the implantation current $I_B$ becomes equal to the set implantation current $I_{BO}$.

Although above-described control is performed with regard to an electrostatic breakdown coefficient only, when productivity needs to be increased, it is desirable that the amount of current be large and the electrostatic breakdown coefficient be low. Therefore, it is desirable to control the current density and the amount of implantation current at a high level.

Figure 5:
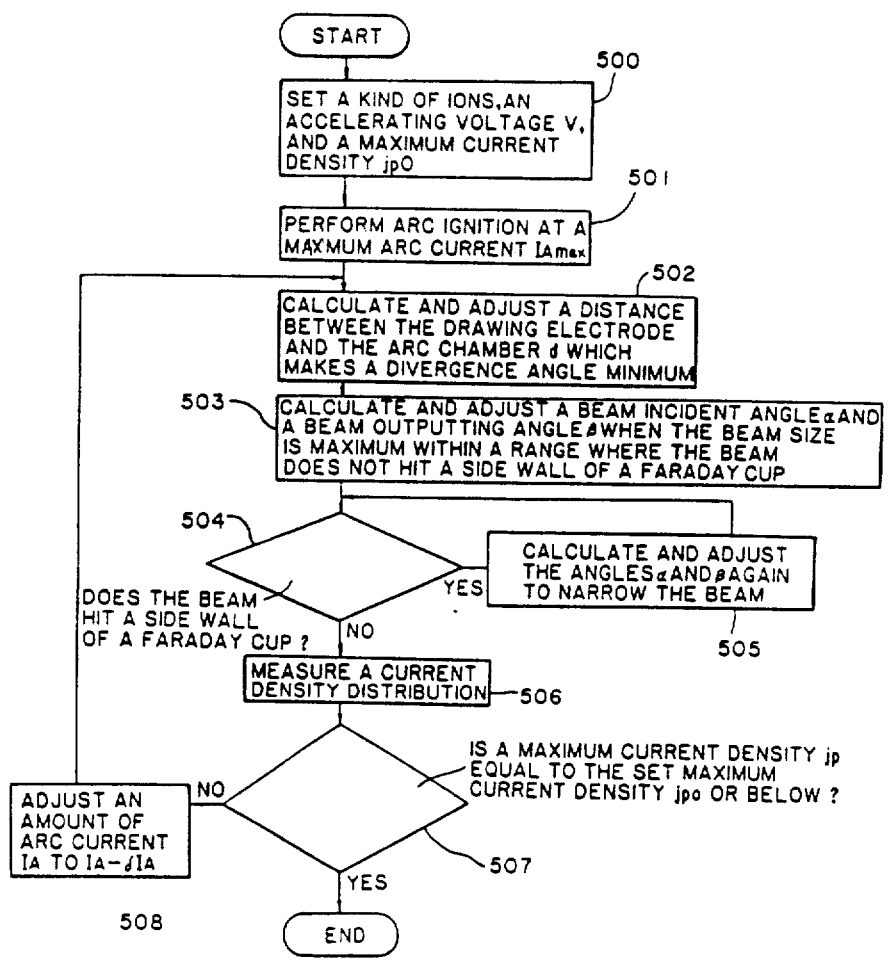
FIG. 5 is a view showing an example of a control algorithm for controlling the ion beam by adjusting the distance between the arc chamber and the beam drawing electrode and the incident angle and the outputting angle of the mass separator in accordance with a theoretical calculation and by performing feedback control using the ion current density distribution measuring apparatus so as not to exceed a set maximum current density.
Figure 7:
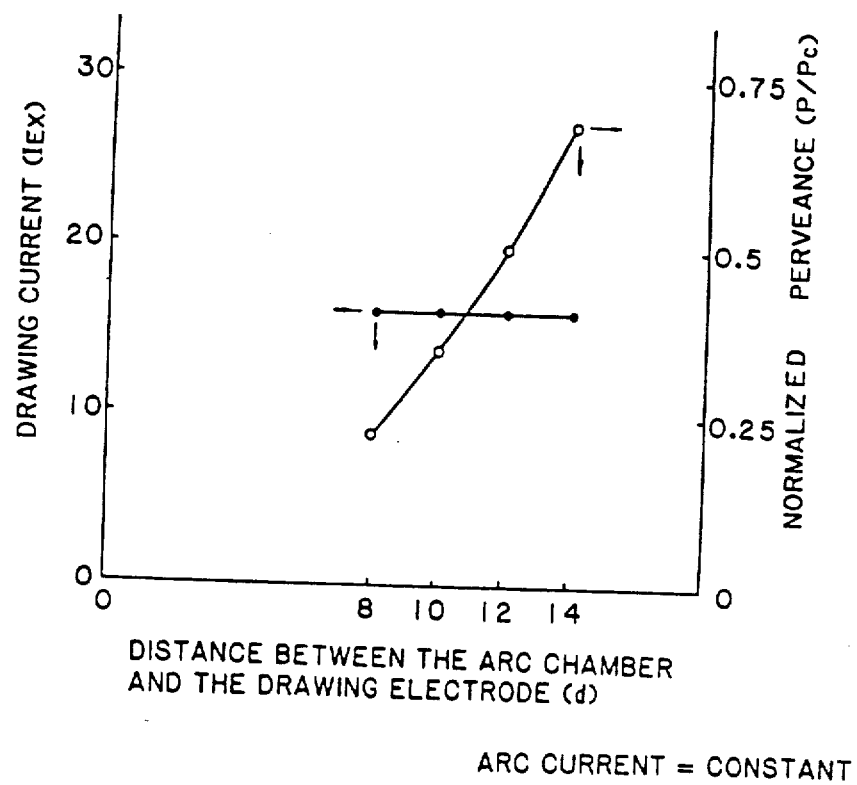

FIG. 5 shows an example of automatic control algorithm in this case.

First, a kind of ions, an accelerating voltage V, an implantation current $I_{BO}$, and a maximum current density $j_{p0}$ are set (500) and arc ignition is performed at a minimum arc current $I_{Amin}$ (501). Then, the distance between the drawing electrode and the arc chamber d which makes the divergence angle minimum is calculated and adjusted (502), and a beam incident angle $\alpha$ and a beam outputting angle $\beta$ are calculated and adjusted when the beam size is a maximum within a range where the beam does not hit a side wall of a Faraday cup (503). If the beam still hits the side wall of the Faraday cup, the beam incident angle $\alpha$ and the beam output angle $\beta$ are repeatedly calculated and adjusted to narrow the beam until a beam which does not hit the side wall of the Faraday cup is obtained (504, 505). Then, the current density distribution is measured (506), and when the maximum current density $j_p$ is higher than the set maximum current density $j_{p0}$ (507), the amount of the arc current $I_A$ is adjusted to $I_A - \delta I_A$ (508), and the process returns to step 502. The processing from 502 is repeated until the maximum current density $j_p$ becomes equal or less than the set maximum current density.

In this algorithm, a maximum implantation current which does not exceed a set maximum current density is obtained.

As a result, it is possible to provide an ion implantation apparatus having good yield and productivity as compared with the conventional implantation apparatus.

Figure 14:
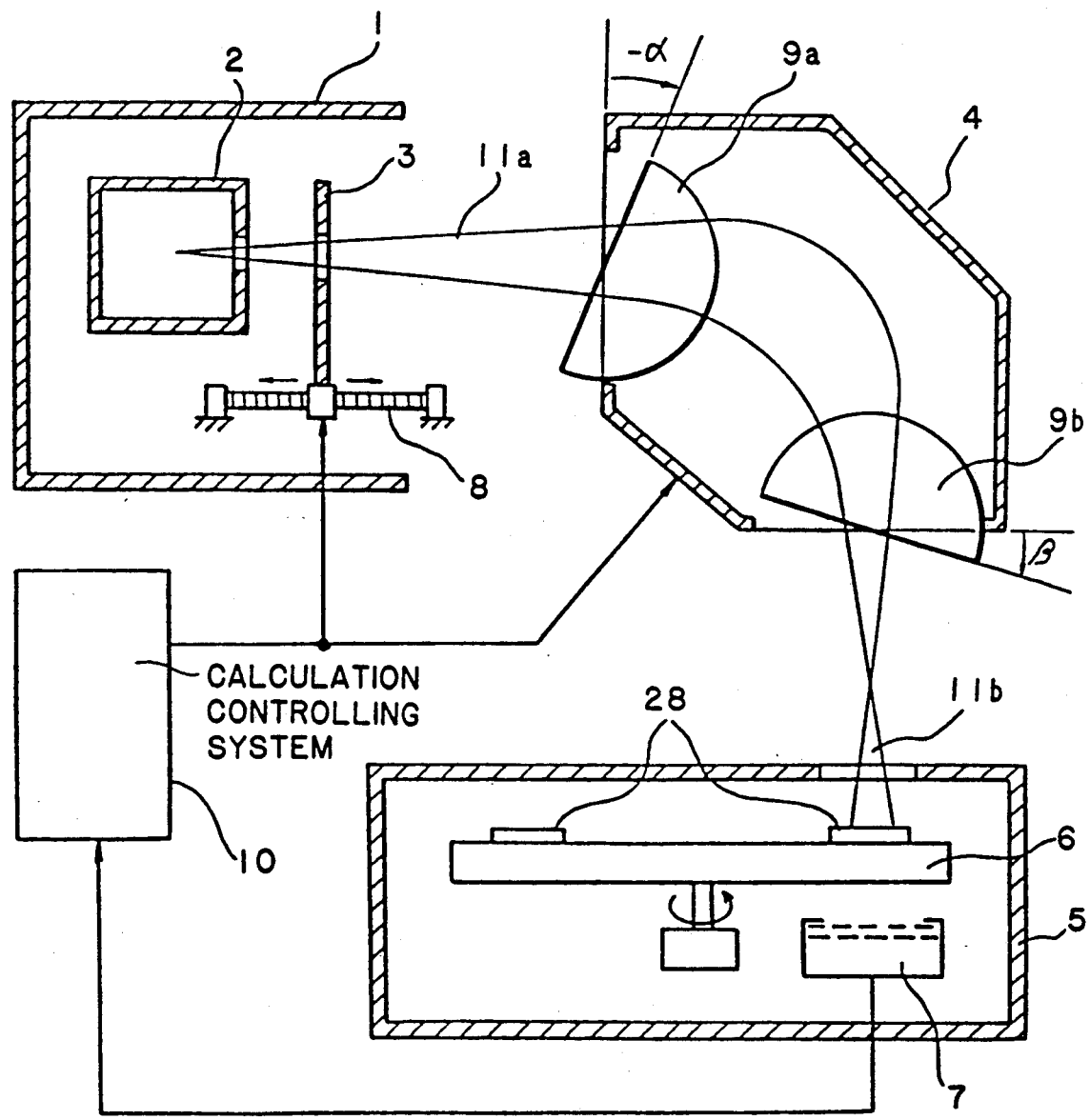
FIG. 14 is a view showing a structure of an ion implantation apparatus in accordance with a fourth embodiment of the present invention.

FIG. 14 is a view showing a structure of an ion implantation apparatus in accordance with a fourth embodiment of the present invention, which comprises ion beam measuring means for feedback control in addition to the means for controlling the distance between the arc chamber and the drawing electrode incrementally in accordance with the theoretical calculation of perveance at the drawing part and the means for controlling the incident and output angles of the ion beam toward the mass separator incrementally in accordance with the above theoretical calculation. In FIG. 14, an ion source 1 comprises an arc chamber 2 generating ions and a drawing electrode 3 drawing ions from the arc chamber 2. A mass separator 4 comprising an incident variable angle mechanism 9a and an output variable angle mechanism 9b produces an ion beam 11b having required ions from an ion beam 11a drawn by a drawing electrode 3. The ion beam 11b is applied to an ion implantation chamber 5. A rotary disc 6 is provided in the ion implantation chamber 5 and wafers 28 are put on the rotary disc 6. An ion beam measuring means 7 is provided at the lower part of the rotary disc 6. A controlling means 10 controls a drawing electrode driving means 8, the incident angle variable mechanism 9a, and the outputting angle variable mechanism 9b in accordance with data obtained by the ion beam measuring means 7.

The automatic control in accordance with the present invention can be applied to continuous control (serial control) in real time or to beam adjustment (batch process) performed at appropriate intervals of time.

In the automatic control using a value of P/Pc, a theoretical calculation may be made at a part of the apparatus or the calculation only may be made in another apparatus. Alternatively, the beam in accordance with the value of P/Pc may be measured to previously confirm the appropriate value of P/Pc and then the apparatus may automatically control a value of d to a position in accordance with the value of P/Pc by setting that value.

The feedback control using the current density distribution measuring apparatus 7 may be used for correcting the theoretical calculation o the feedback control only may be used. In addition, although the conventional feedback control is performed by measuring the beam after mass separation, the automatic control can be performed by monitoring the beam before the mass separation. In this case, it is necessary to confirm the correlation between beams after and before mass separation by a calculation or an experiment.

The same effect can be obtained in the automatic control using the maximum current density as a control parameter even if the maximum value of an accumulated current density of the wafer in the first scanning direction or the amount of implantation current to an element which is obtained by multiplying the accumulated current density by a lateral width of the element is used as the control parameter instead of the maximum current density.

It is assumed that the ion source is in a normal state (to a certain degree) in the automatic control described above. However, setting of the ion source is shifted when the filament is changed, causing an axial shift of the drawing electrode and the beam drawing part of the arc chamber or when wear of the filament is concentrated on an end part, causing a large variation in plasma distribution in some cases. In that case, the distribution of the implanted ion beam is largely significantly varied, with the result that the automatic control sometimes does not work effectively. Therefore, when there is a large variation in the beam distribution found by the ion beam current density distribution measuring apparatus including a simple one in the ion implantation apparatus, an alarm may be generated. When the alarm is given just after the ion source is set, the setting of the drawing electrode or the arc chamber are adjusted so as to remove the variation of the beam distribution or when the alarm is given several times after the ion source is set (a filament is changed), the filament may be changed even if the filament is not broken. Thus, there is no large variation in the beam distribution and then the above automatic control can work effectively.

In FIGS. 2 and 3 showing the automatic control algorithm, the size of the beam is set in the first place. However, in view of the reduction of the electrostatic breakdown coefficient, the beam may as well spread within a range where, for example the beam itself does not hit a side wall of a Faraday cup and an error in reading the amount of current does not occur. In addition, since this spread (that is, the beam size) is peculiar to the apparatus, the beam size may be stored in the calculation apparatus as a constant.

Although the present invention described above is mainly referred to an ion implantation apparatus used when semiconductor devices are manufactured, it may be applied to an ion implantation apparatus used for another purpose (for example surface reforming of metal or the like) from the viewpoint of automatic control for making the beam distribution uniform.

According to the present invention, since the current and current density distribution of an ion beam is controlled by adjusting the distance between an arc chamber and a beam drawing electrode, an ion beam correcting lens can be dispensed with. As a result, beam transporting efficiency is not reduced. In addition, since it is possible to adjust the distance between the arc chamber and the beam drawing electrode incrementally in accordance with a theoretical calculation using normalized perveance at a beam drawing part, control is possible during transport of the beam or it is possible even if there is no ion beam measuring means in an ion implantation chamber, with the result that the size of the apparatus can be reduced.

Furthermore, according to the present invention, since an incident angle and an outputting angle of a mass separator are controlled incrementally in accordance with a theoretical calculation or feedback of measured result, spreading of the beam can be controlled in the vertical and horizontal directions, with the result that a desired beam size can be obtained on a wafer with high precision.

Furthermore, according to the present invention, feedback control is performed using an ion current density distribution measuring apparatus so that a maximum amount of implantation current which does not exceed a set maximum current density can be obtained. As a result, it is possible to provide an ion implantation apparatus having a low electrostatic breakdown coefficient and high productivity.

Although the present invention has been described and illustrated in detail, it is clearly understood that the same is by way of illustration and example only and is not to be taken by way of limitation, the present invention being limited only by the terms of the appended claims.

What is claimed is:

1. An ion implantation apparatus comprising:
    an ion source comprising an arc chamber for generating ions and a drawing electrode separated from and movable relative to said arc chamber for drawing ions from said arc chamber;
    a mass separator for transporting into a beam only ions desired for implantation in a material;
    an ion implantation chamber for receiving the ion beam and for supporting the material on which the ion beam is incident over an area of the material for implantation of the ions in the ion beam in the material; and
    means for moving said drawing electrode relative to said arc chamber to control the separation between said drawing electrode and said arc chamber in response to a calculation of the area of the material considering the normalized perveance of said ion source at said drawing electrode, the ions for implantation, accelerating voltage, ion beam current, and ion beam current density distribution.

2. An ion implantation apparatus in accordance with claim 1 comprising an ion beam current density distribution measuring means for measuring the current density distribution of the ion beam wherein said means for moving controls the separation between said arc chamber and said drawing electrode so that the maximum implantation current density of the ion beam does not exceed a set maximum current density in response to the current density distribution measured by said measuring means.

3. An ion implantation apparatus in accordance with claim 1 comprising an ion beam current density distribution measuring means for measuring the ion beam current density distribution wherein said means for moving controls, in response to the ion beam current density distribution measured by said measuring means, the separation between said arc chamber and said drawing electrode so that the ion beam current is maximized and the maximum ion beam current density is less than a predetermined ion beam current density.

4. An ion implantation apparatus comprising:
   an ion source comprising an arc chamber for generating ions and a drawing electrode separated from and movable relative to said arc chamber for drawing ions from said arc chamber;
   a mass separator for transporting into a beam only ions desired for implantation in a material;
   an ion implantation chamber for receiving the ion beam and for supporting the material on which the ion beam is incident over an area of the material for implantation of the ions in the ion beam in the material; and
   means for automatically controlling an incident angle of the ion beam into and an output angle of the ion beam out of said mass separator in response to a calculation of the area of the material considering the ions for implantation, accelerating voltage, ion beam current, and ion beam current density distribution.

5. An ion implantation apparatus in accordance with claim 4 comprising:
   an ion beam current density distribution measuring means for measuring the ion beam current density distribution wherein said controlling means controls the ion beam incident angle into and the ion beam output angle from the mass separator so that the ion beam current is maximized and does not exceed a predetermined maximum ion beam current density in response to the ion beam current density distribution measured by said measuring means.

* * * * *

UNITED STATES PATENT AND TRADEMARK OFFICE
CERTIFICATE OF CORRECTION

PATENT NO. : 5,132,545
DATED : July 21, 1992
INVENTOR(S) : Shono et al.

It is certified that error appears in the above-identified patent and that said Letters Patent is hereby corrected as shown below:

Column 5, line 37, change "$6^{-1/2}I$" to --$\epsilon^{-1/2}I$--.

Column 8, line 45, change "$Pc \simeq \dfrac{\epsilon_0}{9} \dfrac{S}{d^2} \left[\dfrac{2Ze}{m_i}\right]^{1/2}$" to --$Pc \simeq \dfrac{4\epsilon_0}{9} \dfrac{S}{d^2} \left[\dfrac{2Ze}{m_i}\right]^{1/2}$--.

Column 8, line 60, change "$Y_0 = \tan y$" to --$Y_0' \equiv \tan y$--.

Column 10, line 53, change "$M_{02Y}$" to --$M_{e2Y}$--.

Column 11, line 1, change "$M_{01Y}$" to --$M_{e1Y}$--.

Column 14, line 4, change "$I_A - \delta I_A$" to --$I_A + \delta I_A$--.

Column 15, line 21, change "o" to --or--.

Figure 7:
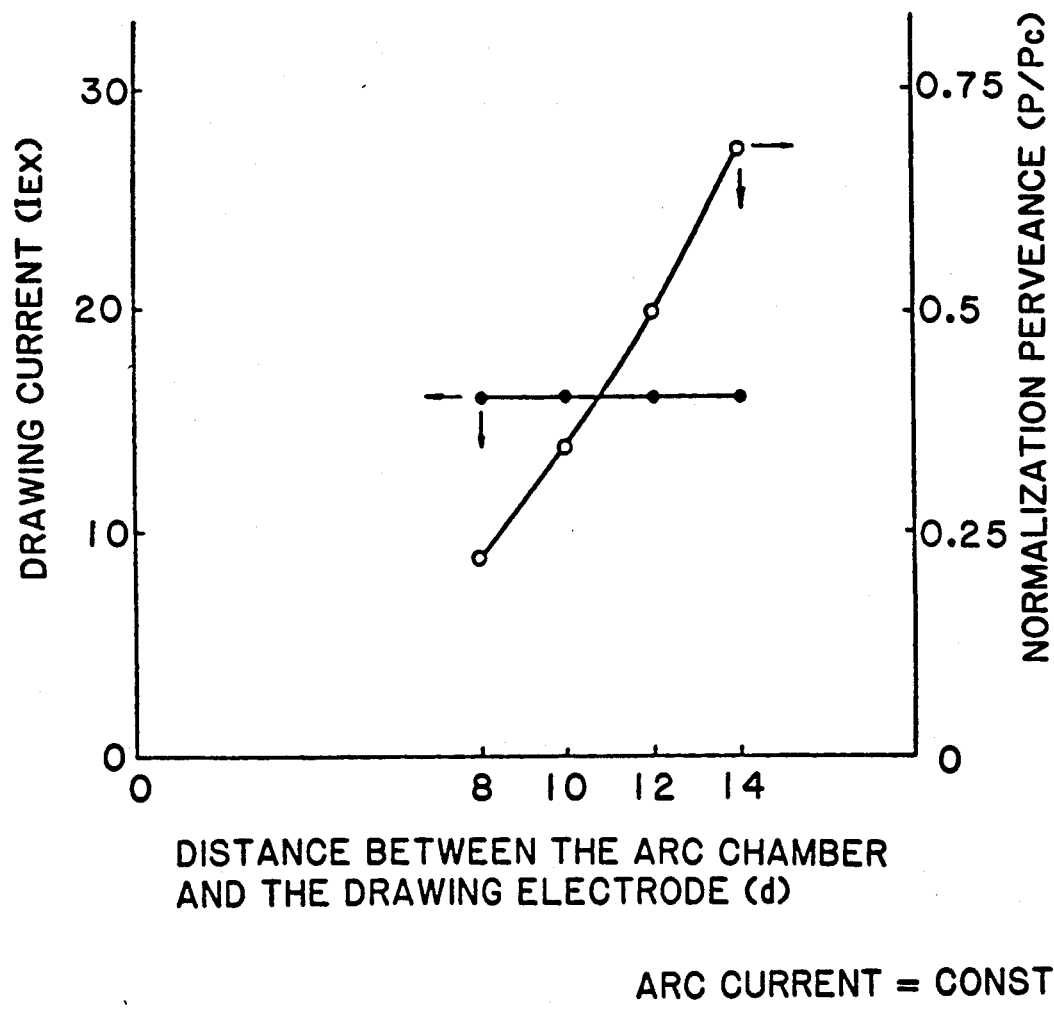
FIG. 7 is a view showing the relation between the distance between the drawing electrode and the arc chamber, a drawing current and normalized perveance.
Figure 8:
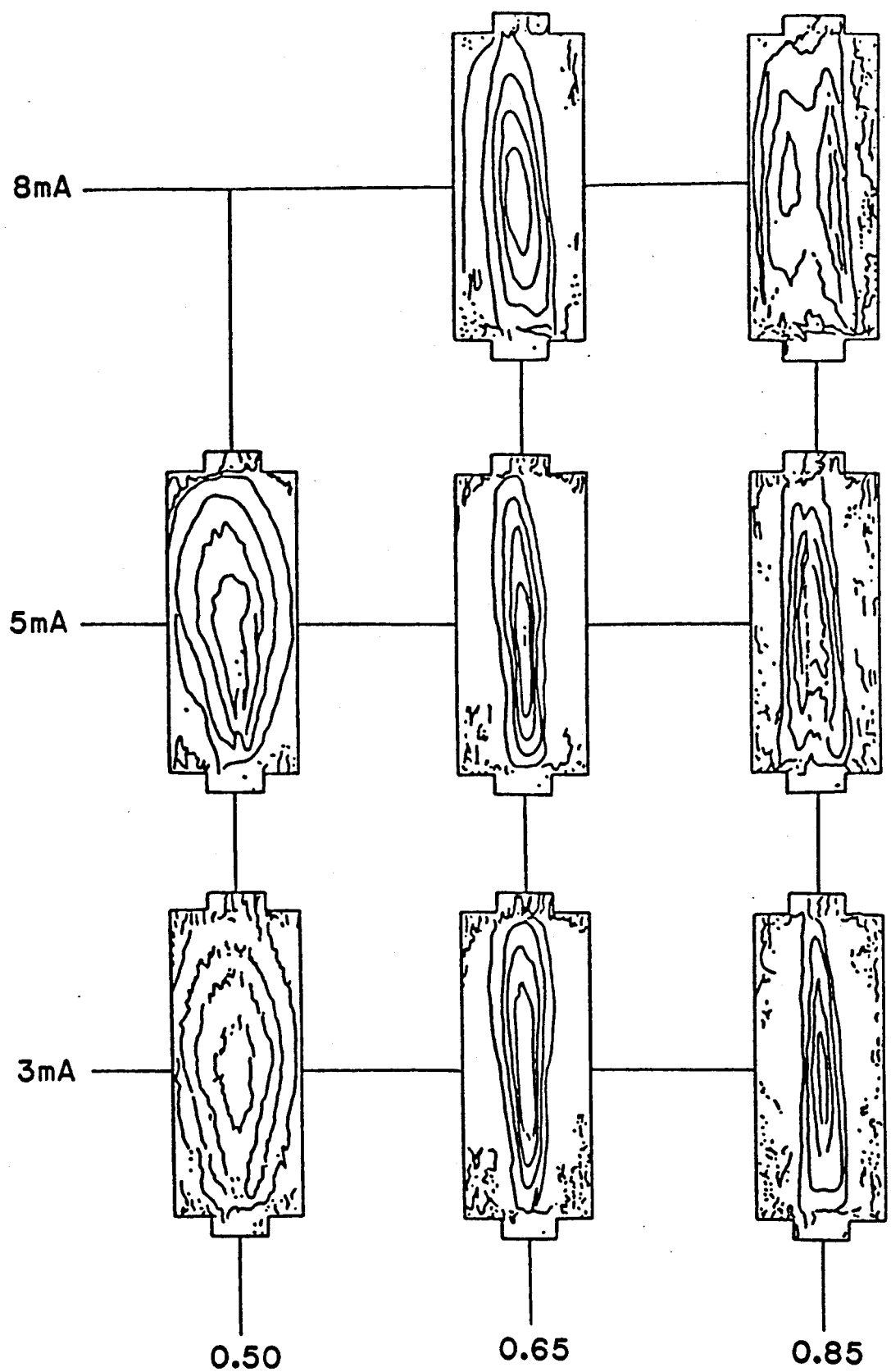
FIG. 8 is a view showing a two-dimensional current density distribution when the normalized perveance and the beam current are used as parameters.

Figures 4, 5, and 7, correct as shown on the attached pages.

Signed and Sealed this

Fifteenth Day of March, 1994

Attest:

BRUCE LEHMAN

Attesting Officer

Commissioner of Patents and Trademarks

ARC CURRENT = CONSTANT